(12) United States Patent
Fukui

(10) Patent No.: US 6,885,450 B2
(45) Date of Patent: Apr. 26, 2005

(54) APPARATUS FOR DETECTING OPTICAL POSITIONAL DEVIATION

(75) Inventor: Tatsuo Fukui, Kawasaki (JP)

(73) Assignee: Nikon Corporation, Tokyo (JP)

( * ) Notice: Subject to any disclaimer, the term of this patent is extended or adjusted under 35 U.S.C. 154(b) by 37 days.

(21) Appl. No.: 09/897,904

(22) Filed: Jul. 5, 2001

(65) Prior Publication Data

US 2002/0003626 A1 Jan. 10, 2002

(30) Foreign Application Priority Data

Jul. 10, 2000 (JP) ........................................ 2000-208634

(51) Int. Cl.[7] ............................................. G01B 11/00
(52) U.S. Cl. ...................................... 356/401; 356/400
(58) Field of Search ............................... 356/399–401, 356/124.1, 24.5, 125, 614, 624; 250/548, 599.3, 201.2, 201.4, 201.7, 201.8; 355/53, 55; 430/5, 22, 30; 382/145, 151

(56) References Cited

U.S. PATENT DOCUMENTS

| | | | |
|---|---|---|---|
| 4,668,077 A | * | 5/1987 | Tanaka ......................... 355/30 |
| 4,687,322 A | * | 8/1987 | Tanimoto et al. ............. 355/55 |
| 5,680,200 A | | 10/1997 | Sugaya et al. |
| 5,754,299 A | | 5/1998 | Sugaya et al. ............... 356/401 |
| 5,920,398 A | * | 7/1999 | Iwanaga et al. ............. 356/401 |
| 6,023,338 A | * | 2/2000 | Bareket ....................... 356/401 |
| 6,081,385 A | * | 6/2000 | Konno et al. ............... 359/637 |
| 6,163,376 A | * | 12/2000 | Nomura et al. ............. 356/401 |
| 6,538,740 B1 | * | 3/2003 | Shiraishi et al. ............ 356/401 |

FOREIGN PATENT DOCUMENTS

JP            08-115874           5/1996

* cited by examiner

Primary Examiner—Zandra V. Smith
Assistant Examiner—Gordon J. Stock, Jr.
(74) Attorney, Agent, or Firm—Oliff & Berridge, PLC

(57) ABSTRACT

An optical positional deviation detecting apparatus comprises an irradiation optical system for irradiating a measurement mark configured by forming a second mark (e.g., a resist mark) on a first mark (e.g., a base mark) with a beam of irradiation, an image forming optical system for forming an image of the measurement mark by converging reflected beam from the measurement mark, an imaging device for photographing the image of the measurement mark, which has been formed by the image forming optical system, an image processing device for measuring the positional deviation in alignment of the second mark with respect to the first mark by processing an image signal obtained by the imaging device, and an image field area adjustment mechanism for adjusting an image field area for the imaging device to photograph the image of the measurement mark.

8 Claims, 5 Drawing Sheets

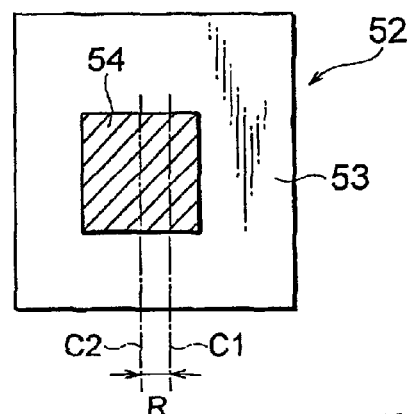
FIG. 2A
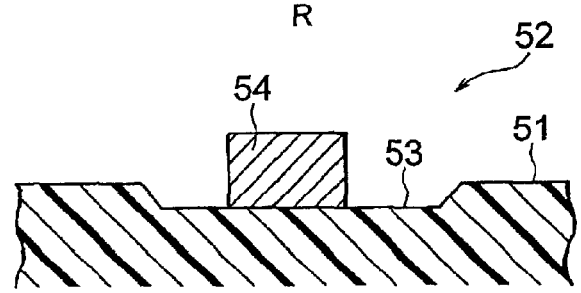
FIG. 2B
FIG. 3A
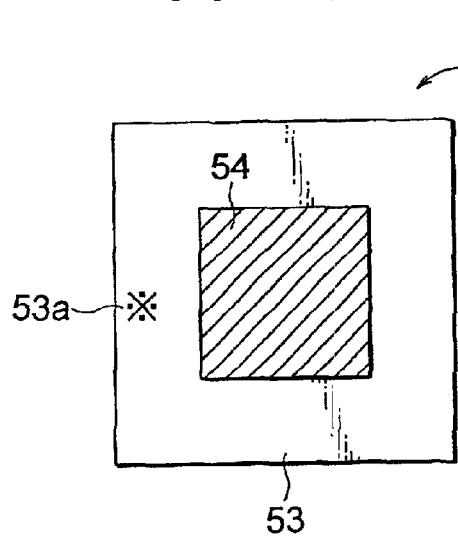
FIG. 3B
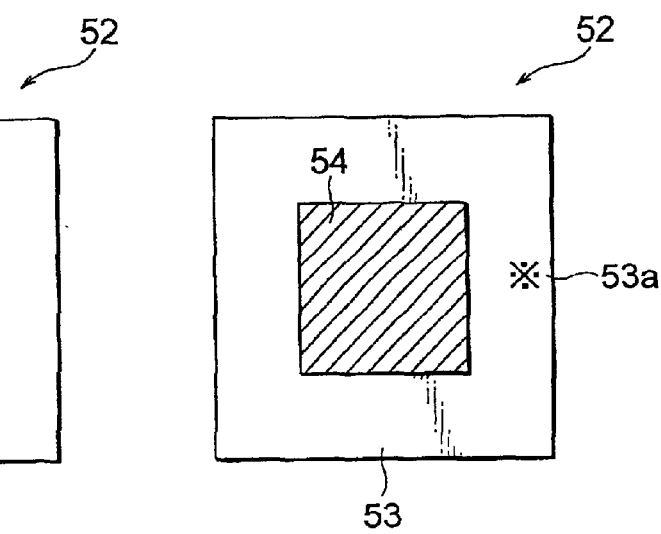

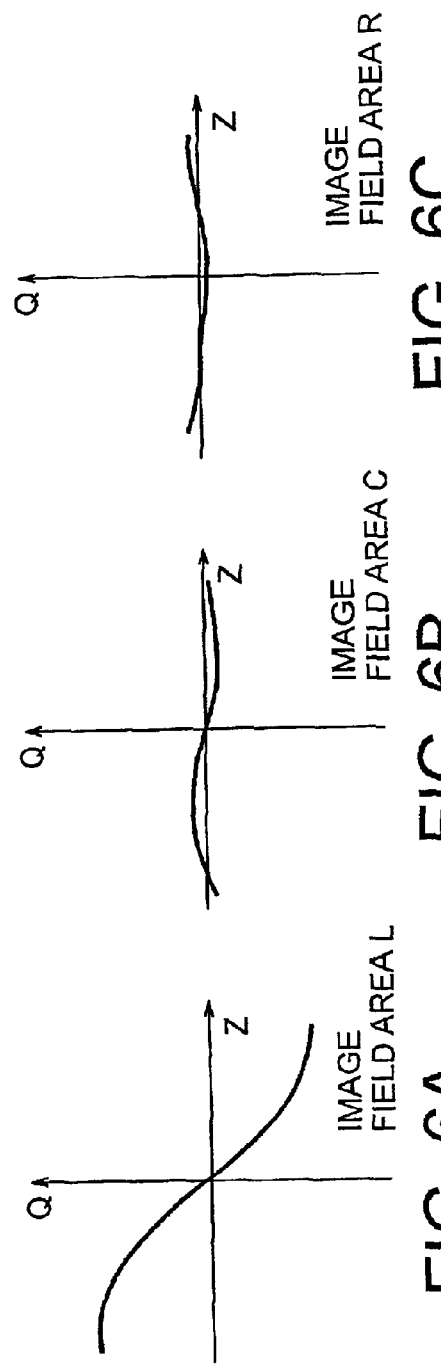
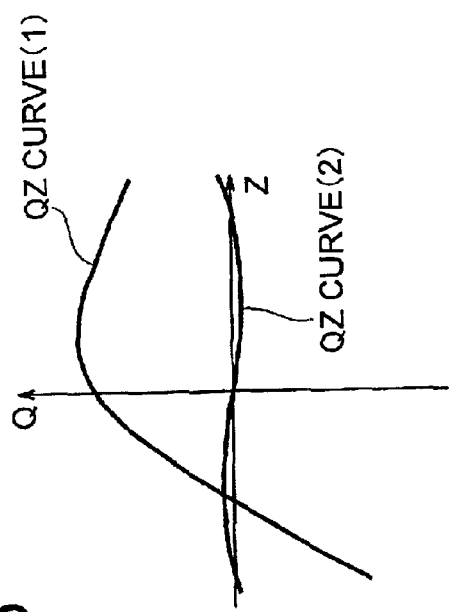

APPARATUS FOR DETECTING OPTICAL POSITIONAL DEVIATION

This application claims the benefit of Japanese Patent application No. 2000-208634 which is hereby incorporated by reference.

BACKGROUND OF THE INVENTION

1. Field of the Invention

The present invention relates to an optical positional deviation detecting apparatus used for optically detecting a positional deviation (an alignment positional deviation) of a second mark (e.g., a resist mark) with respect to a first mark (e.g., a base mark) of a measurement mark (an alignment mark) formed on a substrate to be inspected such as a semiconductor wafer etc. in a photolithography manufacturing process etc. of a semiconductor wafer.

2. Related Background Art

A resist pattern is formed on a wafer at some separate stages in a photolithography manufacturing process defined as one of processes of manufacturing a semiconductor chip. To be specific, a predetermined resist pattern is formed in alignment on an already-formed pattern (which is called a base pattern) at each stage. It is, however, required at every stage that a positional deviation in alignment of the resist pattern with respect to the base pattern be detected and measured. There has hitherto been known an apparatus for detecting this positional deviation in alignment (see, for example, Japanese Patent Application Laid-Open No. 2000-77295). The measurement of the positional deviation in alignment, in which a measurement mark is configured by forming a resist mark on a base mark formed on the substrate when forming the resist pattern, involves the use of an optical positional deviation detecting apparatus (an alignment positional deviation detecting apparatus). In this optical positional deviation detecting apparatus, the measurement mark is irradiated with beams of irradiation, a CCD camera etc. photographs an image of the measurement mark from the reflected beams therefrom, then the photographed image is subjected to image processing, and a positional deviation quantity in alignment of the resist mark with respect to the base mark is measured.

By the way, in the case of optically measuring the positional deviation in alignment as described above, it is inevitable that an optical aberration occurs in a measurement optical system (including, namely, an irradiation optical system for irradiating the measurement mark with the beams of irradiation, and a converging optical system for converging the reflected beams from the measurement mark to form an image of this measurement mark). If this kind of aberration, particularly, an aberration that is rotationally asymmetric with respect to the optical axis exists in a measurement image field area, there occurs a measurement error TIS (Tool Induced Shift) of a measurement value of the alignment positional deviation. A quantity of the rotationally asymmetric aberration, which may be a factor of causing the measurement error TIS, changes depending on the measurement image field area. It is therefore required to set such a measurement image field area that the quantity of the rotationally asymmetric aberration is minimized.

As for the measurement image field area, in terms of measurement error, an optimum image field area might differ depending on elements of the measurement mark (for instance, a height of the resist mark of the measurement mark, a height or depth of the base, a reflectivity, a size and so forth). Hence, even if in the same measurement optical system, it is required that the image field area be adjusted optimal with respect to each of many elements of the measurement mark, and the problem is that the adjustment of the image field area is difficult and time-consuming.

SUMMARY OF THE INVENTION

It is a primary object of the present invention, which was devised to obviate the above problem, to provide an optical positional deviation detecting apparatus capable of searching and setting a common image field area optimal to any kind of measurement mark, and having such a construction as to eliminate an adjustment of the image field area for each element of the measurement mark.

To accomplish the above object, according to one aspect of the present invention, an optical positional deviation detecting apparatus comprises an irradiation optical system for irradiating a measurement mark configured by forming a second mark (e.g., a resist mark) on a first mark (e.g., a base mark) with a beam of irradiation, an image forming optical system for forming an image of the measurement mark by converging reflected beam from the measurement mark, an imaging device for photographing the image of the measurement mark, which has been formed by the image forming optical system, an image processing device for measuring the positional deviation in alignment of the second mark with respect to the first mark by processing an image signal obtained by the imaging device, and an image field area adjustment mechanism for adjusting an image field area for the imaging device to photograph the image of the measurement mark.

The image field area adjustment mechanism is constructed of a field stop provided on the irradiation optical system, a field stop position adjustment mechanism for adjusting a position of the field stop, and an imaging position adjustment mechanism for adjusting a position of the imaging device. The field stop and an imaging surface of the imaging device are disposed in optically conjugate positions. The imaging position adjustment mechanism adjusts the position of the imaging device in accordance with the field stop positional adjustment effected by the field stop position adjustment mechanism. The image field area used when imaging the measurement mark can be thereby set to an optimum area within all the image field areas embraced by the measurement optical system.

In the case of optically detecting the positional deviation in alignment between the first mark and the second mark of the measurement mark by use of the thus constructed optical positional deviation detecting apparatus, the image field area adjustment mechanism is capable of presetting the image field area where the imaging device images the measurement mark, to an area where the measurement error TIS is always minimized regardless of the elements of the measurement mark within all the image field areas embraced by the measurement optical system. If the optimum image field area is thus preset, the alignment positional deviation can be measured by use of the thus set visual field irrespective of the elements of the measurement mark, and the highly efficient adjustment can be made.

It is therefore preferable that the image field area adjustment mechanism adjusts the image field area on the basis of the asymmetric focus characteristic curve of the line and space (L/S) mark pattern image obtained when the L/S mark pattern image is formed within the image field area of the imaging device. Further, it is also preferable that the image field area adjustment mechanism adjusts the image field area so that the asymmetric focus characteristic curve of the L/S mark pattern image obtained when the L/S mark pattern image is formed within the image field area of the imaging device, exhibits a characteristic that is symmetric to the center of the visual field.

BRIEF DESCRIPTION OF THE DRAWINGS

FIGS. 2A and 2B are a plan view and a sectional view each showing a measurement mark used for optically detecting the positional deviation;

FIGS. 3A and 3B are plan views showing the measurement mark in a position of zero degree and a position when rotated through 180 degrees.

FIG. 5 is a graph showing QZ curves with respect to the whole of the L/S mark image pattern;

FIGS. 6A, 6B and 6C are graphs showing the QZ curves in left, central and right areas with respect to the L/S mark image pattern.

DESCRIPTION OF THE PREFERRED EMBODIMENT

Figure 1:
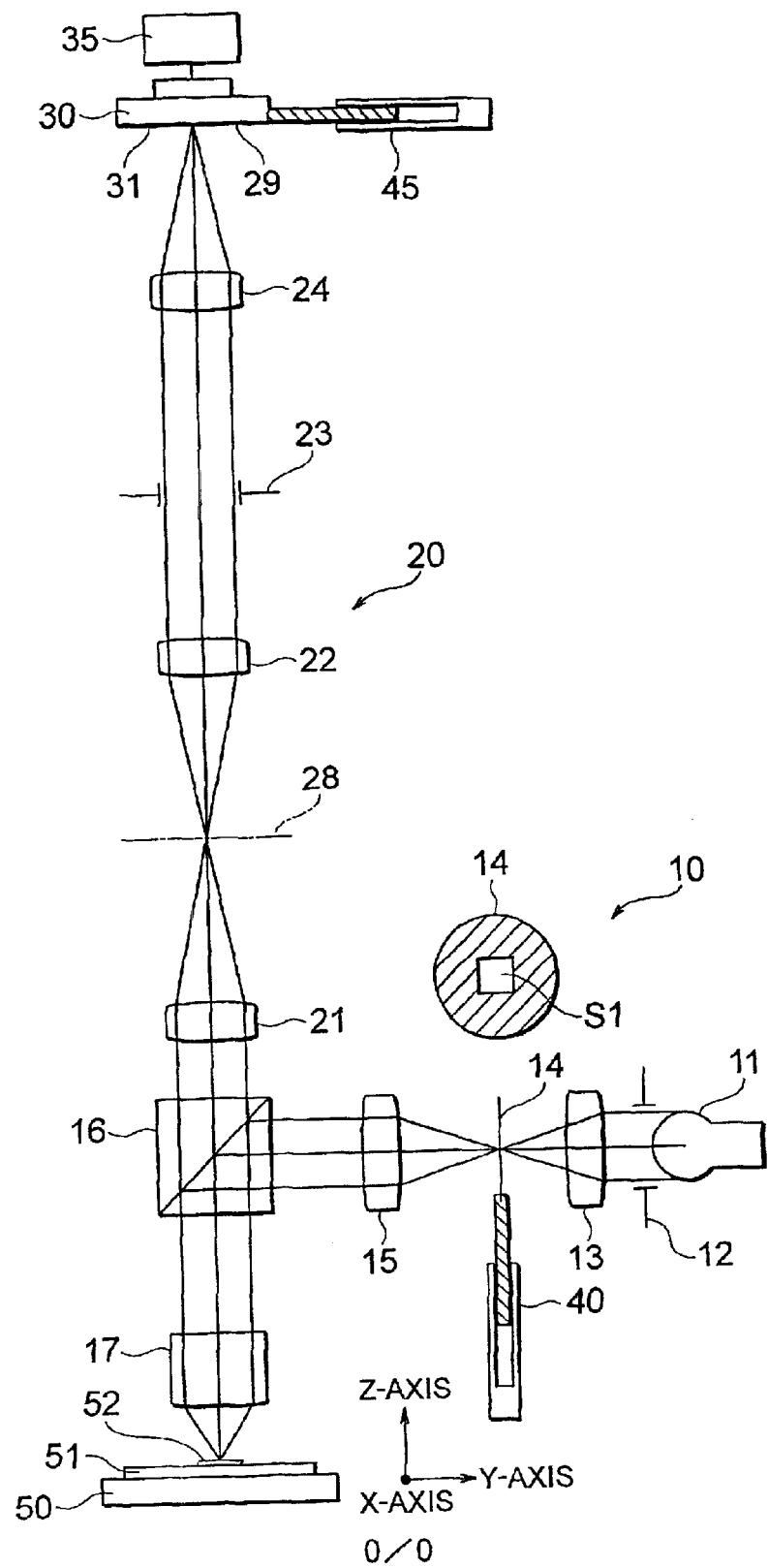
FIG. 1 is a view schematically showing a construction of an optical positional deviation detecting apparatus according to the present invention.

A preferred embodiment of the present invention will hereinafter be described with reference to the accompanying drawings. FIG. 1 shows one example of an apparatus for measuring an optical positional deviation according to the present invention. Note that a direction perpendicular to a sheet surface is set as an X-axis direction, directions extending to the right and left sides are set as Y-directions, and directions extending up and down are set as Z-directions for a simplicity of the explanation.

This measuring apparatus measures a positional deviation in alignment of a resist mark from a measurement mark 52 formed on a wafer 51. When measuring the positional deviation, the wafer 51 is placed on a stage 50 so constructed as to be rotatable and movable horizontally (movable in X-Y directions) and also movable up and down (movable in Z-directions. The measuring mark 52 is configured by forming, when a predetermined resist pattern is formed on a base pattern of the wafer 51 by a photolithography process, as shown in, e.g., FIGS. 2A and 2B, a rectangular resist mark 54 on the rectangular base mark 53 formed along the side end of the wafer 51. The optical positional deviation measuring apparatus according to the present invention measures a positional deviation in alignment of the resist mark 54 with respect to the base mark 53.

This optical positional deviation measuring apparatus includes an irradiation optical system 10 for irradiating the measuring mark 52 with a beam of irradiation, an image forming optical system 20 for forming an image of the measuring mark by converging a beam reflected from the measuring mark, an imaging device 30 for photographing the image of the measuring mark with its image thus formed, and an image processing device 35 for processing an image signal obtained from the imaging device 30.

To start with, the irradiation optical system 10 includes an irradiation source 11, an irradiation aperture stop 12 and a condenser lens 13. The beam of irradiation emitted from the irradiation source 11 is stopped down to a given size (diameter) of beam by the irradiation aperture stop 12, and inputted to and converged by the condenser lens 13. A field stop 14 is irradiated with the irradiation beam converged by the condenser lens 13. The field stop 14 has a rectangular field stop aperture S1 defined by a hatching area in FIG. 1. The field stop 14 so supported by a field stop position adjusting mechanism 40 as to be movable in the X-Z directions (i.e., the field stop 14 is movable within a plane extending up and down in the direction perpendicular to the sheet surface).

The irradiation beam emitted and penetrating the field stop aperture S1 of the field stop 14, falls upon a radiation relay lens 15 and is collimated into a parallel beam by this radiation relay lens 15. The thus collimated beam is incident upon a half prism 16. The irradiation beam reflected by the half prism 16 exits downward and is converged by a first objective lens 17. The converged beam falls vertically upon the measuring mark 52 disposed on the wafer 51. Herein, the field stop 14 and the measuring mark 52 are disposed in positions conjugated with each other in the irradiation optical system 10. The measuring mark 52 on the wafer 51 is irradiated with the irradiation beam taking a shape corresponding to the rectangular shape of the field stop aperture S1.

The reflected beam exiting after the irradiation beam has thus fallen upon the surface of the wafer 51 including the measuring mark 52, is led via the image forming optical system 20 to the imaging device 30. To be specific, the reflected beam is collimated into a parallel beam by the first objective lens 17 and, after passing through the half prism 16, forms an image of the measuring mark 52 on a primary image forming surface 28 by a second objective lens 21 disposed above the half prism 16. Further, the beam penetrates a first image forming relay lens 22 and stopped down to a given size of beam by an image forming aperture stop 23, and forms an image of the measuring mark 52 on a secondary image forming surface 29 by a second image forming relay lens 24.

The CCD camera (the imaging device) 30 is disposed so that the secondary image forming surface 29 becomes coincident with an imaging surface 31. The CCD camera 30 captures an image of the measuring mark 52. Then, an image signal obtained by the CCD camera 30 is sent to the image processing device 35, wherein the image signal is processed as will be described later on. As can be known from this arrangement, the measuring mark 52 and the imaging surface 31 have a conjugate positional relationship. Note that the CCD camera 30 is so supported by an imaging position adjustment mechanism 45 as to be movable in the X-Y directions (i.e., movable within a plane extending in the right-and-left directions perpendicular to the sheet surface).

The measuring mark 52, as shown in FIGS. 2A and 2B, consists of the base mark 53 taking a rectangular recessed configuration formed on the surface of the wafer 51, and the resist mark 54 formed on the base mark 53 simultaneously when forming a resist pattern in the photolithography manufacturing process. A setting in the photolithography manufacturing process is that the resist mark 54 is formed in a central position of the base mark 53, and a quantity of positional deviation of the resist mark 54 with respect to the base mark 53 corresponds to a quantity of positional deviation in alignment of the resist pattern with respect to a base pattern. Therefore, as shown in FIG. 2A, the optical positional deviation detecting apparatus having the construction described above measures an interval R between a central line C1 of the base mark 53 and a central line C2 of the resist mark 54 as an optical positional deviation in alignment. Note that the alignment positional deviation quantity R shown in FIG. 2A is defined as a positional deviation quantity in the Y-axis direction (the lateral direction), however, a positional deviation quantity in the direction orthogonal to the Y-axis direction, i.e., in the X-axis direction (the vertical direction) is likewise measured.

When thus measuring the alignment positional deviation quantity R of the measuring mark 52, if there exists an aberration, particularly, a rotationally asymmetric aberration in the measuring optical system (i.e., the irradiation optical system 10 and the image forming optical system 20), a problem arises, wherein a measured value of the alignment positional deviation quantity R contains a measurement error TIS. This measurement error TIS will be briefly explained. This measurement is, as shown in FIGS. 3A and 3B, executed in two directions where the measuring mark 52 is positioned at zero degree and rotated through 180 degrees. That is, at first, as shown in FIG. 3A, an alignment positional deviation quantity $R_0$ of the resist mark 54 with respect to the base mark 53 is measured in a state where an imaginary position mark 53a is positioned on the left side. Next, as shown in FIG. 3B, an alignment positional deviation quantity $R_{180}$ is measured in a state where the imaginary position mark 53a is positioned on the right side by rotating the measuring mark 52 through 180 degrees. Then, the measurement error TIS is calculated in the following formula (1):

$$TIS=(R_0+R_{180})/2 \qquad (1)$$

As known from the formula (1), even if there is an alignment positional deviation of the resist mark 54 with respect to the base mark 53, the measurement error TIS calculated by the formula (1) to theoretically becomes zero. If an optical aberration, particularly, a rotationally asymmetric aberration exists in the measurement optical system, however, even in the case of rotating the measuring mark 52 through 180 degrees, this does not mean that this aberration is rotated. Hence, a value corresponding to only an influence of the aberration is obtained as the measurement error TIS from a result of the calculation in the formula (1).

If the alignment positional deviation quantity R is measured by the optical positional deviation measuring apparatus while containing the measurement error TIS occurred due to the optical aberration described above, a precise alignment positional deviation quantity R can not be measured. Therefore, the optical positional deviation measuring apparatus of the present invention makes such an image field area adjustment as to restrain the influence of the measurement error TIS to the greatest possible degree. This will be touched in the following discussion.

Figure 4A:
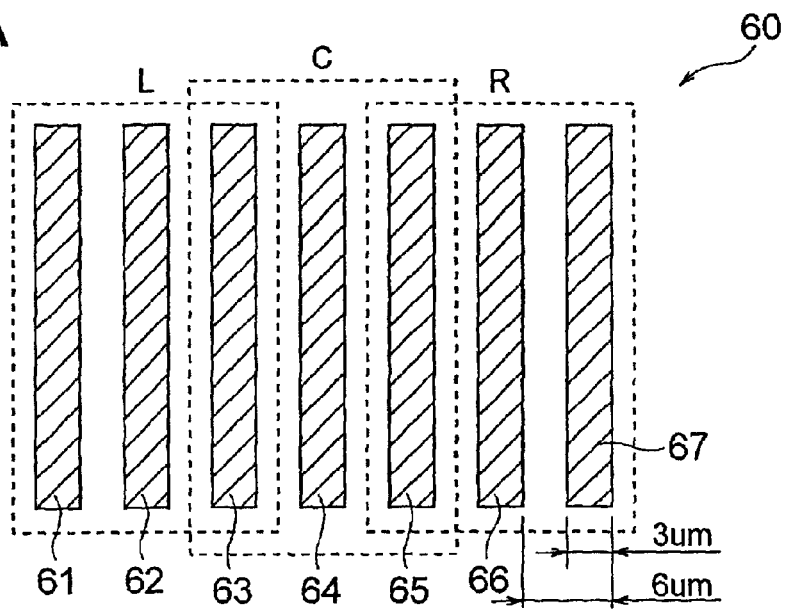
FIGS. 4A and 4B are a plan view and a sectional view each showing an L/S mark pattern used for adjusting an image field area.
Figure 4B:
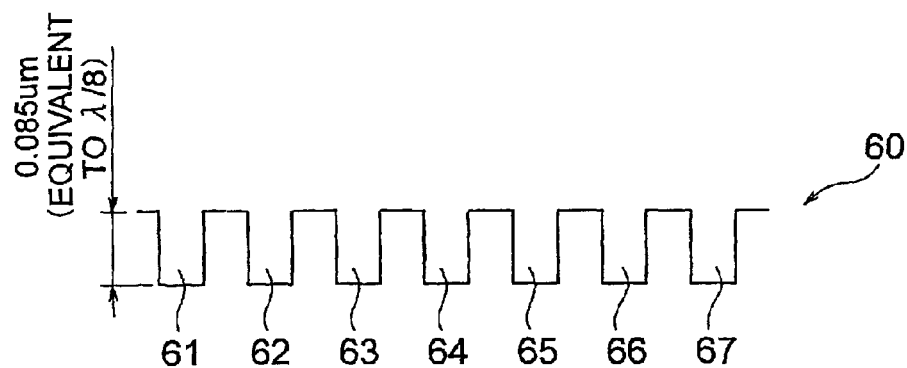

The image field area is adjusted by placing on the stage 50 a wafer formed with an L/S mark pattern 60 taking a configuration as shown in FIGS. 4A and 4B as a substitute for the wafer 51 in the apparatus shown in FIG. 1, and processing an image of the L/S mark photographed by the CCD camera 30, which involves irradiating the L/S mark pattern 60 with the beam from the irradiation optical system 11. This L/S mark pattern 60 is, as shown in FIGS. 4A and 4B, composed of a plurality of linear marks 61~67 each having a line width of 3 μm, a recessed depth of 0.085 μm (equivalent to ⅛ of an irradiation beamλ) and extending in parallel with each other at a pitch of 6 μm.

Figure 4C:
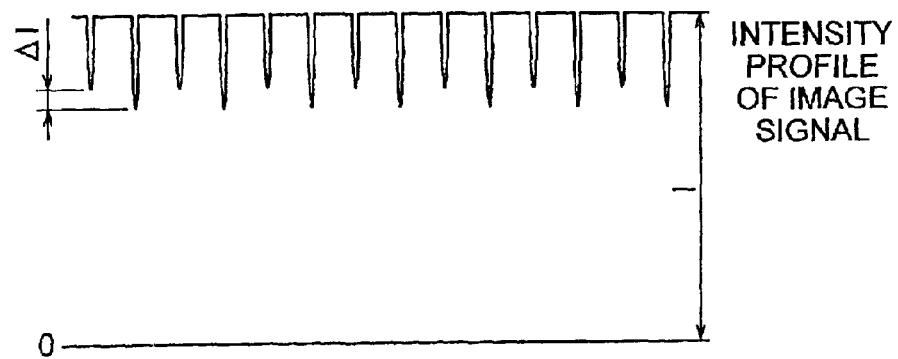
FIG. 4C is a graph showing a profile of an image signal intensity of the L/S mark image pattern.

The image processing device 35 processes the image of the L/S mark pattern captured by the CCD camera 30, thereby obtaining an intensity of the image signal. A profile of the intensity becomes as shown in FIG. 4C. Herein, though the signal intensity decreases in the recessed positions of the linear marks 61–67, a signal intensity difference ΔI in the recessed positions on both right and left sides of every linear mark, is obtained, and these signal intensity differences ΔI of all the linear marks 61–67 are averaged, thereby obtaining a value Q (Q=1/7×Σ(ΔI/I)) representing an asymmetry of the L/S mark pattern image. Next, the L/S mark pattern 60 is moved in the Z-direction by moving the stage 50 in the up-and-down direction (the Z-direction), and the value Q is obtained per height position (the position in the Z-direction), thus obtaining a focus characteristic of the value Q. This focus characteristic is expressed by, for instance, QZ curves as shown in FIG. 5.

FIG. 5 shows two types of QZ curves, i.e., a QZ curve (1) and a QZ curve (2). The QZ curve (1) shows a large rotationally asymmetric aberration, while the QZ curve (2) shows a small rotationally asymmetric aberration. It may therefore be considered that such an adjustment as to exhibit the QZ curve (2) be made.

The following is a brief explanation of this kind of adjustment (which may be called a QZ adjustment). A shape of the QZ curve is determined by a telecentricity of radiation (a tilt of the irradiation beam), an eclipse of the image forming beam, an eccentric coma aberration and so on. Hence, the QZ adjustment involves adjusting the telecentricity of radiation (the tilt of the irradiation beam) by adjusting the X- and Z-axis directional positions of the irradiation aperture stop 12, and the eclipse of the image forming beam is adjusted by adjusting the X- and Z-axis directional positions of the image forming aperture stop 23. Moreover, the eccentric coma aberration is corrected by making an eccentric movement of the whole or a part of the lens system of the lenses 21, 22 in the direction perpendicular to the optical axis. The details of the QZ adjustment are disclosed in Japanese Patent Application Laid-Open No. 2000-77295.

According to the present invention, the image field area adjustment is performed in the way that follows. To begin with, the whole L/S mark pattern shown in FIGS. 4A and 4B is adjusted based on the QZ adjusting method so that the focus characteristic changes from the state of the QZ curve (1) to the state of the QZ curve (2) shown in FIG. 5. Next, the linear marks 61~67 configuring the L/S mark pattern 60 shown in FIGS. 4A and 4B are divided into a group of the left area linear marks 61~63 each positioned within a left area L, a group of central area linear marks 63~65 each positioned within a central area C, and a right area linear marks 65~67 each positioned within a right area R. Then, a value Q is obtained by averaging the signal intensity differences ΔI of the linear marks existing in each of these areas, and QZ curves in the respective areas are obtained as shown in FIGS. 6A–6C. Note that FIGS. 6A–6C each show one example of the thus obtained QZ curve in each area. In this case, the rotationally asymmetric aberration is large in the left area L and small both in the central area C and in the right area R. The QZ curves shown in FIGS. 6A–6C are displayed by a monitor.

The CCD camera captures an image of the measuring mark 52 by use of the visual fields areas exhibiting the characteristics shown in FIGS. 6A–6C, and the alignment positional deviation quantity R of the resist mark 54 with respect to the base mark 53, is measured. In this case, it must be inevitable that the measurement error TIS calculated by the formula (1) occurs, and it is difficult to obtain the accurate alignment positional deviation quantity R.

Therefore, next, the field stop position adjustment mechanism 40 adjusts the position of the field stop 14, and the field area in the measurement optical system is changed. Note that the positions of the L/S mark pattern 60 and of the CCD camera 30, which are optically conjugate to the field stop 14, are adjusted by the imaging position adjustment mechanism 45 with the aid of the stage 50, corresponding to this positional adjustment of the field stop 14. Then, in a state where the field area adjustment has been thus done, the QZ adjustment described above is again performed. Thereafter, the QZ curves in the left, central and right areas L, C and R are obtained in the same way as the above. Such field area adjustment may be conducted by an operation observing the display on the monitor or automatically.

Figure 7C:
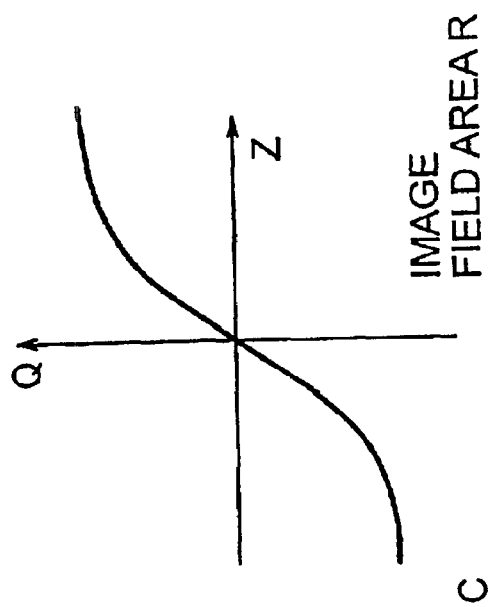
FIGS. 7A, 7B and 7C are graphs showing the QZ curves in the left, central and right areas with respect to the L/S mark image pattern.
Figure 7B:
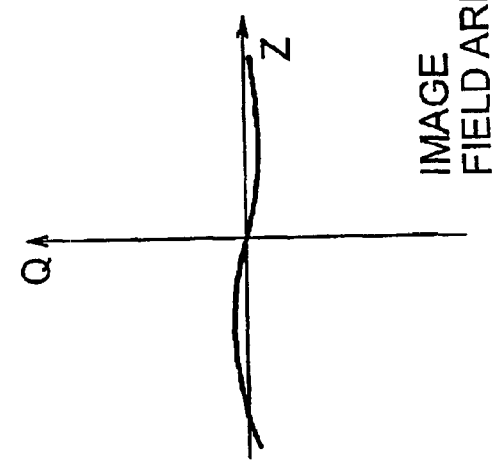
Figure 7A:
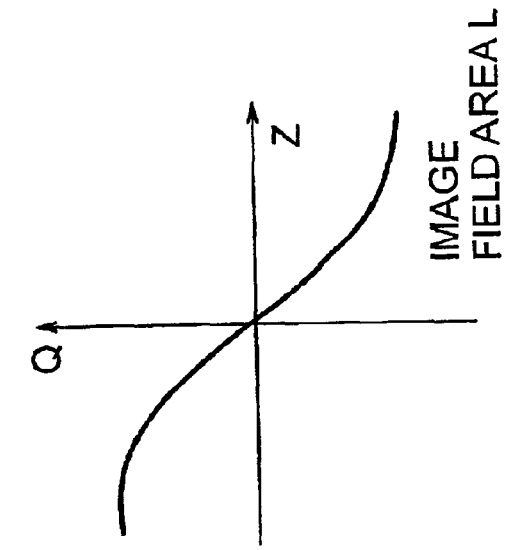

There is searched such a field area that each of the QZ curves in the left, central and right areas L, C and R, which have been obtained by changing the field area, comes to show a lateral symmetry with respect to the center of the visual field as shown in FIGS. 7A–7C. Then, the alignment positional deviation of the measuring mark 52 is measured by this field area in the case of such a field area that the QZ curves of the L/S mark pattern image exhibit the characteristics as shown in FIGS. 7A–7C, for instance, even when rotating the L/S mark pattern 60 through 180 degrees, the characteristics are optically much the same because the QZ curves in the right and left areas are symmetric. The QZ curves shown in FIGS. 7A–7C are displayed by the monitor.

Therefore, the CCD camera 30 captures the image of the measuring mark 52 in this field area, and the alignment positional deviation quantity R of the resist mark 54 with respect to the base mark 53, is measured. Then, an error based on the rotationally asymmetric aberration contained in the alignment positional deviation quantity $R_0$ and an error based on the rotationally asymmetric aberration contained in the alignment positional deviation quantity $R_{180}$, are cancelled each other in the calculation by the formula (1), resulting in an extremely small measurement error TIS. The accurate alignment positional deviation quantity R can be thereby obtained. Thus, there is set such a field area that the error based on the rotationally asymmetric aberration contained in the alignment positional deviation quantity $R_0$ and the error based on the rotationally asymmetric aberration contained in the alignment positional deviation quantity $R_{180}$, are cancelled each other in the calculation by the formula (1), whereby the alignment positional deviation quantity can be always precisely measured irrespective of the elements of the measurement mark.

As discussed above, according to the present invention, when optically detecting the alignment positional deviation of the second mark (the resist mark) with respect to the first mark (the base mark) of the measurement mark, the image field area adjustment mechanism is capable of presetting the image field area where the imaging device images the measurement mark, to an area where the measurement error TIS is always minimized regardless of the elements of the measurement mark within all the image field areas embraced by the measurement optical system. If the optimum image field area is thus preset, the alignment positional deviation can be measured by use of the thus set visual field irrespective of the elements of the measurement mark, and the highly efficient adjustment can be made.

It is therefore preferable that the image field area adjustment mechanism adjusts the image field area on the basis of the asymmetric focus characteristic curve of the L/S mark pattern image obtained when the L/S mark pattern image is formed within the image field area of the imaging device. Further, it is also preferable that the image field area adjustment mechanism adjusts the image field area so that the asymmetric focus characteristic curve of the L/S mark pattern image obtained when the L/S mark pattern image is formed within the image field area of the imaging device, exhibits a characteristic that is symmetric to the center of the visual field.

What is claimed is:

1. An optical positional deviation detecting apparatus for optically detecting a positional deviation in alignment between a first mark and a second mark of a measurement mark configured by forming the second mark on the first mark, comprising:

an irradiation optical system for irradiating the measurement mark with a beam of irradiation;

an image forming optical system for forming an image of the measurement mark by converging reflected beam from the measurement mark;

an imaging device for photographing the image of the measurement mark, which has been formed by said image forming optical system;

an image processing device for measuring the positional deviation in alignment between the first mark and the second mark by processing an image signal obtained by said imaging device; and a field stop provided on said irradiation optical system; and a field stop position adjustment mechanism for adjusting a position of said field stop, in a plane perpendicular to the optical axis, while maintaining a size of the image field fixed;

wherein said field stop position adjustment mechanism adjusts the field stop position on the basis of an asymmetric focus characteristic of a line and space mark pattern image obtained when forming the image of a line and space mark pattern within an image field area of said imaging device.

2. An optical positional deviation detecting apparatus according to claim 1, wherein said field stop position adjustment mechanism adjusts the field stop position so that the asymmetric focus characteristic of the line and space mark pattern image obtained when forming the image of the line and space mark pattern within the image field area of said imaging device, exhibits a characteristic that is symmetric with respect to an axis which passes through the center of the image field and which is perpendicular to a direction in which the positional deviation is detected.

3. An optical positional deviation detecting apparatus according to claim 1, wherein said field stop position is so adjusted that the focus characteristic on a signal intensity difference at a stepped position on both sides of each line mark or each space mark of at least a set of the line marks or space marks which are symmetric with respect to the center of the image field, among the line marks of said line and space mark, has a characteristic which is symmetric with respect to an axis which passes through the center of the image field which is perpendicular to a direction in which the positional deviation is detected.

4. An optical positional deviation detecting apparatus according to claim 1, wherein said field stop position adjustment mechanism adjusts said field stop position so that, at least one set of pattern areas which are symmetric with respect to the center of the image field, is selected;

then a focus characteristic of a value Q represented by the below formula (1) for each pattern area:

$$Q = 1/n \times \Sigma(\Delta I/I) \tag{1}$$

where n is the number of lines (spaces) in the selected pattern area;

I is a signal intensity at a non-stepped portion of a stepped portion in each line (or space) within the center of said image field and which is perpendicular to a detecting direction of said positional deviation in alignment;

ΔI is a difference of signal intensity at both sides of the stepped portion in each line (or space) within the selected pattern area, is obtained; and then the focus characteristic curve is symmetric with respect to an axis which passes through the center of said image field.

5. An optical positional deviation detecting apparatus for optically detecting a positional deviation in alignment between a first mark and a second mark of a measurement mark configured by forming the second mark on the first mark, comprising:

an irradiation optical system for forming an image of the measurement mark with a beam of irradiation;

an image forming optical system for forming an image of the measurement mark by converging reflected beam from the measurement mark;

an imaging device for capturing the image of the measurement mark, which has been formed by said image forming optical system;

an image processing device for measuring the positional deviation in alignment between the first mark and the second mark by processing an image signal obtained by said imaging device;

a field stop provided on said irradiation optical system; and a field stop position adjustment mechanism for adjusting a position of said field stop, in a plane perpendicular to the optical axis, while maintaining a size of the field stop fixed;

wherein said field stop position adjustment mechanism further comprises an imaging device position adjustment mechanism and adjusts the position of said imaging device in accordance with the field stop positional adjustment effected by said field stop adjustment mechanism; and wherein said field stop position adjustment mechanism adjusts the field stop position on the basis of an asymmetric focus characteristic of a line and space mark pattern image obtained when forming the image of the line and space mark pattern within an image field area of said imaging device.

6. An optical positional deviation detecting apparatus for optically detecting a positional deviation in alignment between a first mark and a second mark of a measurement mark configured by forming the second mark on the first mark, comprising:

an irradiation optical system for irradiating the measurement mark with a beam of irradiation;

an image forming optical system for forming an image of the measurement mark by converging reflected beam from the measurement mark;

an imaging device for capturing the image of the measurement mark, which has been formed by said image forming optical system;

an image processing device for measuring the positional deviation in alignment between the first mark and the second mark by processing an image signal obtained by said imaging device;

a field stop provided on said irradiation optical system; and a field stop position adjustment mechanism for adjusting a position of said field stop, in a plane perpendicular to the optical axis, while maintaining a size of the image field fixed;

wherein said field stop position is so adjusted that at least one set of areas which are symmetric with respect to the center of the image field is selected and an amount of rotationally asymmetric aberration for every selected area is symmetric, in a predetermined focal area in which a focused area is included, with respect to an axis which passes through the center of said image field and which is perpendicular to a detecting direction of said positional deviation in alignment.

7. An optical adjustment method of an optical positional deviation detecting apparatus for optically detecting a positional deviation in alignment between a first mark and a second mark of a measurement mark configured by forming the second mark on the first mark, the method comprising:

providing an irradiation optical system for irradiating the measurement mark with a beam of irradiation;

providing an image forming optical system for forming an image of the measurement mark by converging reflected beam from the measurement mark;

providing an imaging device for capturing the image of the measurement mark, which has been formed by said image forming optical system; and providing an image field position adjustment mechanism for adjusting, in a plane perpendicular to the optical axis, a position of an image field for capturing the image of the measurement mark by said imaging device while maintaining a size of the image field fixed, wherein the providing an image field position adjustment mechanism comprises:

adjusting an aperture stop of said irradiation optical system and an aperture stop of said imaging device so that a focus characteristic has a value of Q as defined by:

$$Q = 1/n \times \Sigma(\Delta I/I) \qquad (2),$$

where n is the number of lines (spaces) in a selected pattern area;

I is a signal intensity at a non-stepped portion of the pattern or the area therearound a stepped portion in each line (or space) within the center of said image field and which is perpendicular to a detecting direction of said positional deviation in alignment; and ΔI is a difference of signal intensity at both sides of the stepped portion in each line (or space) within the selected pattern area, Q is zero and relates to a line and space mark in the entirety thereof at the time when the line and space mark image is formed within the image field of said imaging field;

adjusting a position of a field stop of the irradiation optical system so that the asymmetric focus characteristic of said line and space mark pattern image within the image field area of said imaging device exhibits a characteristic that is symmetric with respect to an axis which passes through the center of the image field and which is perpendicular to a direction in which the positional deviation is detected; and adjusting a position of said imaging device for the adjusted field stop position.

8. An optical adjustment method of an optical positional deviation detecting apparatus for optically detecting a positional deviation in alignment between a first mark and a second mark of a measurement mark configured by forming the second mark on the first mark, the method comprising:

providing an irradiation optical system for irradiating the measurement mark with a beam of irradiation;

providing an image forming optical system for forming an image of the measurement mark by converging reflected beam from the measurement mark;

providing an imaging device for capturing the image of the measurement mark, which has been formed by said image forming optical system; and providing an image field position adjustment mechanism for adjusting, in a plane perpendicular to the optical axis, a position of an image field for capturing the image of the measurement mark by said imaging device while maintaining a size of the image field fixed, wherein the providing an image filed position adjustment mechanism comprises:

adjusting an aperture stop of said irradiation optical system, an aperture stop of said imaging optical system and a whole or a part of the lens system of a second objective lens or a first image formation relay lens of said imaging optical system so that a focus characteristic has a value of Q being equal to $$Q = 1/n \times \Sigma(\Delta I/I) \qquad (3),$$

where n is the number of lines (spaces) in a selected pattern area;

I is a signal intensity at a non-stepped portion of the pattern or the area therearound a stepped portion in each line (or space) within the center of said image field and which is perpendicular to a detecting direction of said positional deviation in alignment; and $\Delta I$ is a difference of signal intensity at both sides of the stepped portion in each line (or space) within the selected pattern area, Q is zero and relates to said line and space mark in the entirety thereof at the time when the line and space mark image is formed within the image field of said imaging field;

adjusting a position of a field stop of the irradiation optical system on the basis of an asymmetric focus characteristic curve of said line and space mark image; and adjusting the position of said imaging device is adjusted for the adjusted image field position.

* * * * *